(12) United States Patent
Lott et al.

(10) Patent No.: US 12,471,221 B2
(45) Date of Patent: Nov. 11, 2025

(54) CLAMPING DEVICE WITH PIVOTING RETAINER

(71) Applicant: Raytheon Company, Waltham, MA (US)

(72) Inventors: Patrick J. Lott, Lowell, MA (US); Christopher O'Brien, Somerville, MA (US)

(73) Assignee: Raytheon Company, Tewksbury, MA (US)

( * ) Notice: Subject to any disclaimer, the term of this patent is extended or adjusted under 35 U.S.C. 154(b) by 489 days.

(21) Appl. No.: 17/971,307

(22) Filed: Oct. 21, 2022

(65) Prior Publication Data
US 2024/0138073 A1 Apr. 25, 2024
US 2024/0237226 A9 Jul. 11, 2024

(51) Int. Cl.
*H05K 3/32* (2006.01)

(52) U.S. Cl.
CPC ...................... *H05K 3/32* (2013.01)

(58) Field of Classification Search
CPC ....................................... H05K 3/32
USPC ..................................... 439/65, 66
See application file for complete search history.

(56) References Cited

U.S. PATENT DOCUMENTS

| | | | |
|---|---|---|---|
| 7,099,156 B2 * | 8/2006 | McClure | F16B 19/109 |
| 7,171,165 B2 * | 1/2007 | Azman | H04L 1/0021 |
| | | | 455/67.11 |
| 7,239,158 B2 | 7/2007 | Kazama | |
| 7,447,041 B2 | 11/2008 | Brandenburg | |
| 7,480,144 B2 * | 1/2009 | Li | H01L 23/4093 |
| | | | 165/104.34 |
| 7,596,846 B2 * | 10/2009 | Hoeckelman | F16B 19/109 |
| | | | 33/774 |
| 7,606,032 B2 * | 10/2009 | Lin | F16B 35/041 |
| | | | 361/709 |
| 7,869,217 B2 * | 1/2011 | Chen | H01L 23/4093 |
| | | | 361/709 |
| 8,300,413 B2 * | 10/2012 | Chen | F16B 13/0808 |
| | | | 165/185 |
| 8,534,651 B2 | 9/2013 | Scapa | |
| 10,473,135 B2 | 11/2019 | McClure | |
| 11,758,690 B2 * | 9/2023 | Yeh | H05K 7/2039 |
| | | | 361/704 |

(Continued)

FOREIGN PATENT DOCUMENTS

| GB | 553142 A | 5/1943 |
|---|---|---|
| JP | H0846341 A | 2/1996 |

OTHER PUBLICATIONS

International Search Report for PCT/US2023/035523 dated Feb. 19, 2024.

*Primary Examiner* — Harshad C Patel
(74) *Attorney, Agent, or Firm* — Getz Balich LLC

(57) ABSTRACT

A method is provided for assembling an apparatus. During this method, a circuit element is arranged with a circuit board. The circuit element includes an element aperture. The circuit board includes a board aperture. A plunger is moved in a first direction to pass a distal end of the plunger through the element aperture and the board aperture and into a volume adjacent the circuit board. A retainer is pivoted within the volume. The retainer is pivotally mounted to the plunger at the distal end of the plunger. The plunger is moved in a second direction to clamp the circuit board between the retainer and the circuit element.

19 Claims, 12 Drawing Sheets

(56) References Cited

U.S. PATENT DOCUMENTS

| | | | |
|---|---|---|---|
| 2006/0171129 A1 | 8/2006 | Berto | |
| 2012/0260482 A1* | 10/2012 | Graham | B23P 21/00 |
| | | | 901/41 |
| 2015/0053670 A1* | 2/2015 | Horn | C21D 1/42 |
| | | | 219/632 |
| 2016/0200462 A1* | 7/2016 | Kriheli | G06Q 10/06316 |
| | | | 700/214 |
| 2016/0301786 A1* | 10/2016 | Koltsov | H04M 1/24 |
| 2018/0150114 A1* | 5/2018 | Lambert | H05K 7/20154 |
| 2021/0190108 A1 | 6/2021 | Newton | |

\* cited by examiner

CLAMPING DEVICE WITH PIVOTING RETAINER

BACKGROUND OF THE DISCLOSURE

1. Technical Field

This disclosure relates generally to a device for clamping components together during assembly of an apparatus.

2. Background Information

Various devices are known in the art for clamping components together during assembly of electronic equipment. While these known devices have various benefits, there is still room in the art for improvement. There is a need in the art, for example, for a clamping device which can simplify and/or facilitate automation of electronic equipment assembly.

SUMMARY OF THE DISCLOSURE

According to an aspect of the present disclosure, a method is provided for assembling an apparatus. During this method, a circuit element is arranged with a circuit board. The circuit element includes an element aperture. The circuit board includes a board aperture. A plunger is moved in a first direction to pass a distal end of the plunger through the element aperture and the board aperture and into a volume adjacent the circuit board. A retainer is pivoted within the volume. The retainer is pivotally mounted to the plunger at the distal end of the plunger. The plunger is moved in a second direction to clamp the circuit board between the retainer and the circuit element.

According to another aspect of the present disclosure, another method is provided for assembling an apparatus. During this method, a first element is arranged with a substrate. The first element includes an element aperture. The substrate includes a substrate aperture. A plunger is moved in a first direction to pass a distal end of the plunger through the element aperture and the substrate aperture and into a volume adjacent the substrate. A retainer is pivoted within the volume. The retainer is pivotally mounted to the plunger at the distal end of the plunger. The plunger is moved in a second direction opposite the first direction to clamp the first element and the substrate between the retainer and a clamp base. The plunger is movably mated with the clamp base. The plunger is moved in the second direction using at least a spring element biased between the plunger and the clamp base.

According to still another aspect of the present disclosure, a clamping device is provided. This clamping device includes a clamp base, a plunger, a first spring element, a retainer and a second spring element. The clamp base includes a base aperture extending axially along a centerline through the clamp base. The plunger is mated with the base aperture and configured to move relative to the clamp base between a retracted position and an extended position. The plunger includes a plunger base, a shank and a mount. The shank projects axially along the centerline from the head, out of the base aperture, to the mount when the plunger is in the extended position. The first spring element is disposed within the base aperture and compressed between the clamp base and the plunger base when the plunger is in the extended position. The retainer is pivotally attached to the mount and configured to pivot between a stowed position and a deployed position. The retainer is in the stowed position and within the base aperture when the plunger is in the retracted position. The retainer is in the deployed position and exterior to the clamp base when the plunger is in the extended position. The second spring element is configured to pivot the retainer from the stowed position to the deployed position.

The first spring element may be configured as or otherwise include a compression spring element. The second spring element may be configured as or otherwise include a tension spring element.

The first element may be configured as or otherwise include a circuit element. The substrate may be configured as or otherwise include a printed circuit board.

The retainer may include a first end portion, a second end portion and an intermediate portion. The first end portion and the second end portion may each be abutted against the substrate when the first element and the substrate are clamped between the retainer and the clamp base. The intermediate portion may be between the first end portion and the second end portion. The intermediate portion may be pivotally mounted to the plunger.

The moving of the plunger in the first direction may include translating the plunger in the first direction along a centerline. The pivoting of the retainer may include pivoting the retainer within the volume about an axis that is angularly offset from the centerline.

The retainer may be pivoted at least seventy-five degrees within the volume.

The pivoting of the retainer within the volume may be passively actuated.

The retainer may be pivoted within the volume by a spring element.

The spring element may be a tension spring element.

The plunger may be moved in the second direction using at least a spring element.

The spring element may be a compression spring element.

The plunger may be arranged with a clamp base. The plunger may move relative to the clamp base during at least a portion of the moving of the plunger in the first direction and during the moving of the plunger in the second direction. The circuit element and the circuit board may be clamped between the clamp base and the retainer.

The plunger may be arranged with a clamp base. The plunger may move with the clamp base during a first portion of the moving of the plunger in the first direction. The plunger may move relative to the clamp base during a second portion of the moving of the plunger in the first direction. The circuit element and the circuit board may be clamped between the clamp base and the retainer.

The plunger may be disengaged from the circuit board while the circuit board is clamped between the retainer and the circuit element.

The method may also include soldering a lead of the circuit element to a conductive path of the circuit board while the circuit board is clamped between the retainer and the circuit element.

The method may also include: electrically coupling the circuit element to the circuit board; removing a clamping device from the circuit element and the circuit board, where the clamping device includes the plunger and the retainer; and securing the circuit element to the circuit board with a fastener, where the fastener extends through the element aperture and the board aperture.

The method may also include moving the plunger in the first direction using a manipulator.

The method may also include: moving a second plunger in the first direction to pass a distal end of the second plunger through a second element aperture in the circuit element and a second board aperture in the circuit board and into the volume; pivoting a second retainer within the volume, where the second retainer is pivotally mounted to the second plunger at the distal end of the second plunger; and moving the second plunger in the second direction to further clamp the circuit board between the second retainer and the circuit element.

Any one or more or all of the features described in at least any one or more or all of paragraphs 6-22 above may be combined with the aspect described in paragraph 3. Any one or more or all of the features described in at least any one or more or all of paragraphs 6-22 above may be combined with the aspect described in paragraph 4. Any one or more or all of the features described in at least any one or more or all of paragraphs 6-22 above may be combined with the aspect described in paragraph 5. For this aspect, where features described in paragraphs 6-22 comprise method steps, respective elements may be configured to perform those method steps. The present disclosure, of course, is not limited to the foregoing exemplary combinations. The present disclosure, more particularly, may include any one or more of the individual features disclosed above and/or below alone or in any combination thereof.

The foregoing features and the operation of the invention will become more apparent in light of the following description and the accompanying drawings.

DETAILED DESCRIPTION

Figure 1:
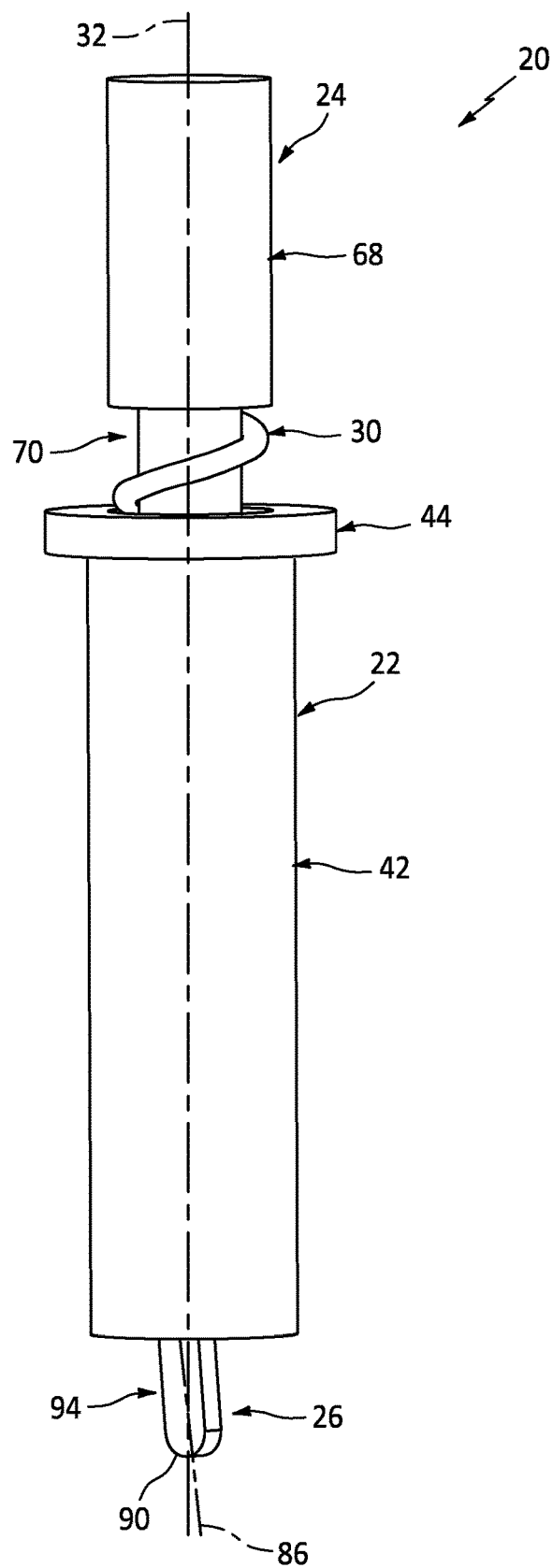
FIG. 1 is a perspective illustration of a clamping device in a retracted position.
Figure 2:
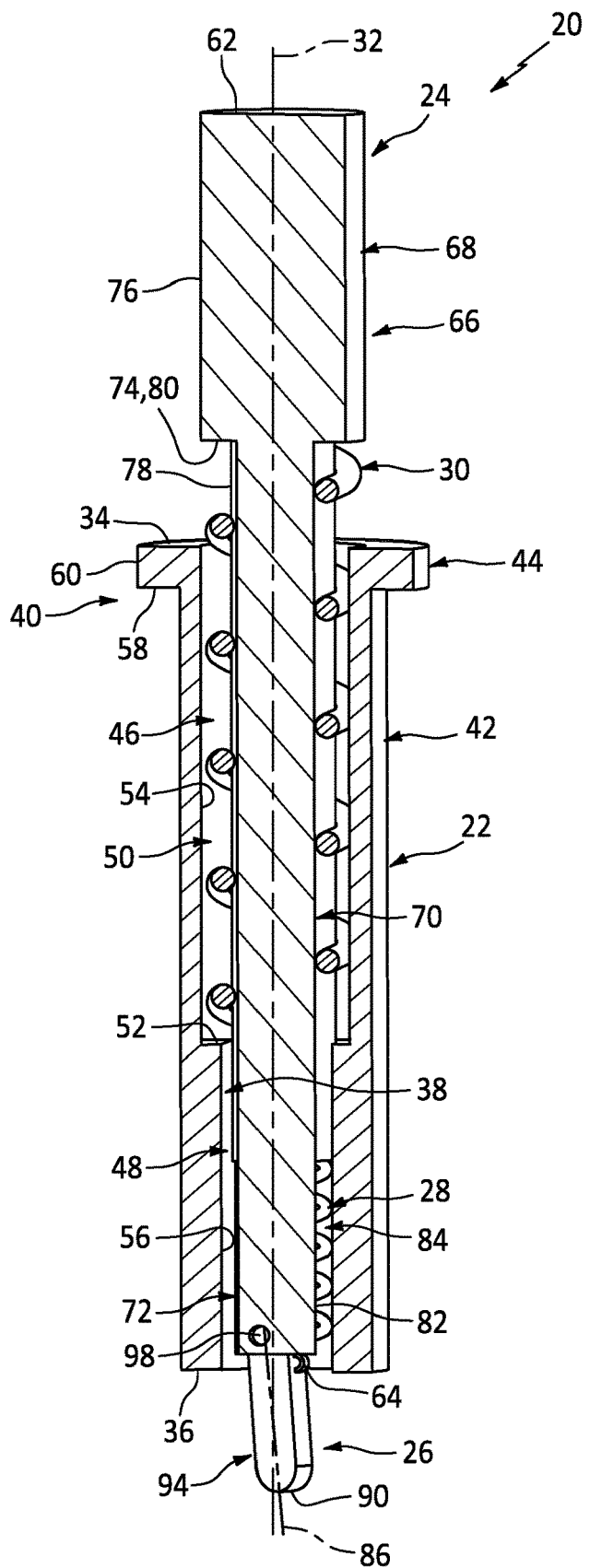
FIG. 2 is a perspective cutaway illustration of the clamping device in the retracted position.
Figure 3:
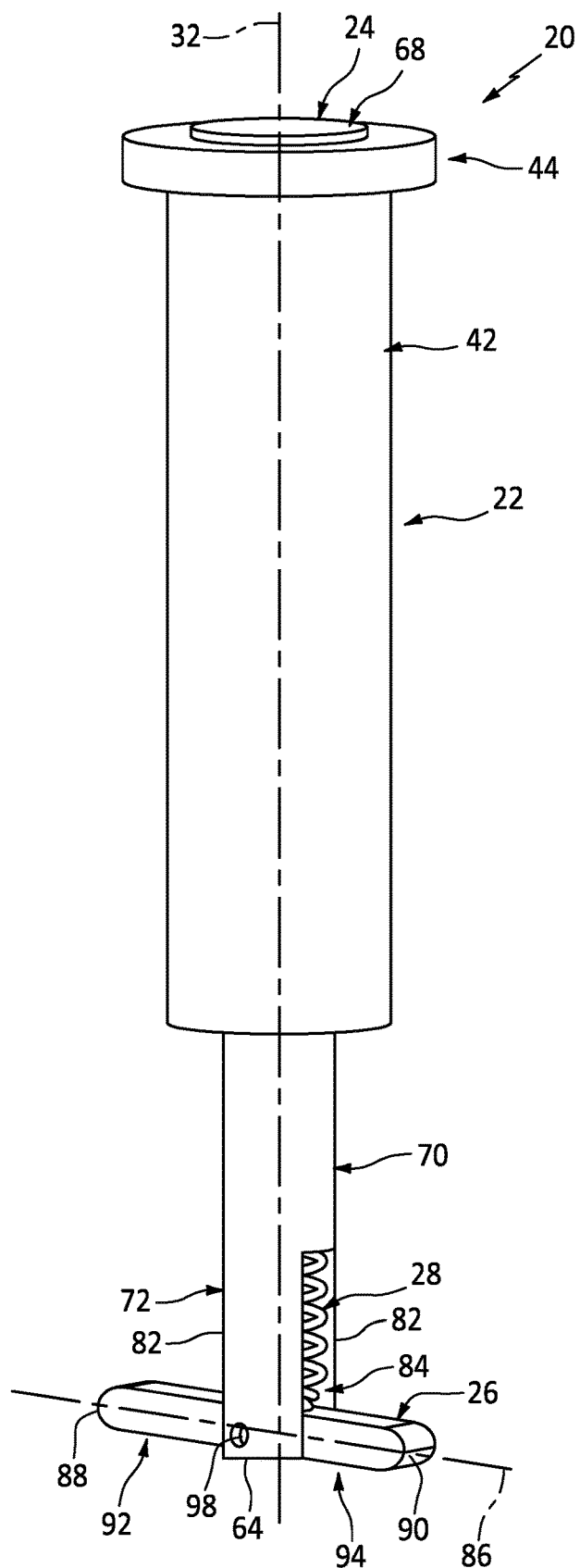
FIG. 3 is a perspective illustration of the clamping device in an extended position.
Figure 4:
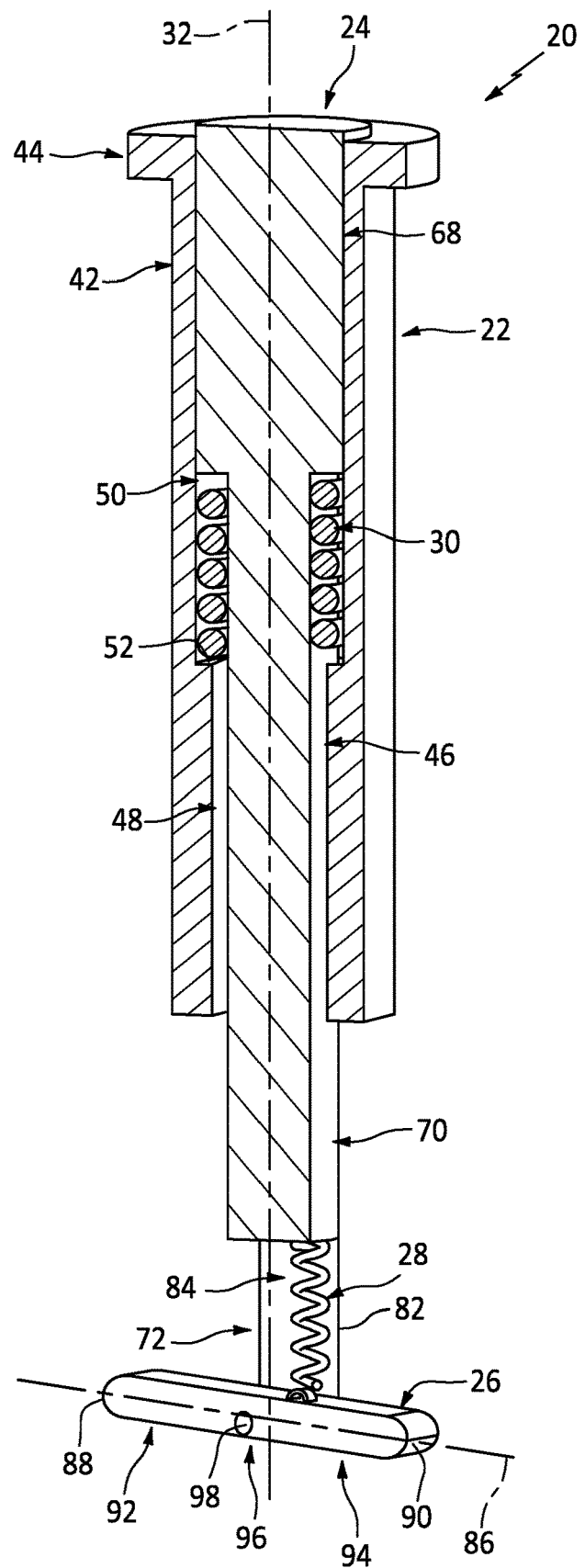
FIG. 4 is a perspective cutaway illustration of the clamping device in the extended position.

FIGS. 1-4 illustrate a device 20 for clamping components together during assembly of an apparatus such as, but not limited to, an electronic device. Examples of the apparatus components include, but are not limited to, a circuit element and a circuit board. FIGS. 1 and 2 illustrate the clamping device 20 in a retracted arrangement. FIGS. 3 and 4 illustrate the clamping device 20 in an extended arrangement. This clamping device 20 of FIGS. 1-4 includes a clamp base 22, a clamp plunger 24, a clamp retainer 26 and one or more spring elements 28 and 30; e.g., coil springs.

Referring to FIG. 2, the clamp base 22 extends axially along an axial centerline 32 of the clamping device 20 between and to a first end 34 of the clamp base 22 and a second end 36 of the clamp base 22. The clamp base 22 of FIG. 2 extends radially (relative to the axial centerline 32) between and to an inner side 38 of the clamp base 22 and an outer side 40 of the clamp base 22. The clamp base 22 extends circumferentially about (e.g., completely around) the axial centerline 32, thereby providing the clamp base 22 with, for example, a tubular body. The clamp base 22 of FIG. 2 includes a (e.g., tubular) base sidewall 42 and a (e.g., annular) base flange 44.

The base sidewall 42 extends axially along the axial centerline 32 from the base first end 34 to the base second end 36. The base sidewall 42 is disposed at the base inner side 38, and forms a base aperture 46 within the clamp base 22. This base aperture 46 may extend axially along the axial centerline 32 through the clamp base 22 between and to the base first end 34 and the base second end 36. The base aperture 46 of FIG. 2, for example, includes a bore 48 and a counterbore 50. The bore 48 projects axially along the axial centerline 32 from the base second end 36 towards the base first end 34, and to the counterbore 50. The counterbore 50 projects axially along the axial centerline 32 from the base first end 34 towards the base second end 36, and to the bore 48. With this arrangement, a (e.g., annular) base shelf 52 may be formed within the base aperture 46 at an axial intersection between the bore 48 and the counterbore 50. This base shelf 52 extends radially between and to a first inner surface 54 of the base sidewall 42 forming the counterbore 50 and a second inner surface 56 of the base sidewall 42 forming the bore 48.

The base flange 44 is disposed at (e.g., on, adjacent or proximate) the base first end 34. The base flange 44 of FIG. 2, for example, extends axially along the axial centerline 32 from the base first end 34 to a second end 58 of the base flange 44. The base flange 44 is connected to (e.g., formed integral with) the base sidewall 42. The base flange 44 projects radially out from the base sidewall 42 to a distal end 60 of the base flange 44 at the base outer side 40.

The clamp plunger 24 extends axially along the axial centerline 32 between and to a first end 62 of the clamp plunger 24 and a second (e.g., distal) end 64 of the clamp plunger 24. The clamp plunger 24 extends radially out from the axial centerline 32 to an outer side 66 of the clamp plunger 24. The clamp plunger 24 extends circumferentially about (e.g., completely around) the axial centerline 32. The clamp plunger 24 of FIG. 2 includes a plunger base 68, a plunger shank 70 and a plunger mount 72.

The plunger base 68 may be configured as a head of the clamp plunger 24. The plunger base 68 is disposed at the plunger first end 62. The plunger base 68 of FIG. 2, for example, extends axially along the axial centerline 32 between and to the plunger first end 62 and a second end 74 of the plunger base 68. The plunger base 68 projects radially out from the axial centerline 32 to an (e.g., cylindrical) outer surface 76 of the plunger base 68 at the plunger outer side 66.

The plunger shank 70 extends axially along the axial centerline 32 between and to the plunger base 68 and the plunger mount 72. The plunger shank 70 is connected to (e.g., formed integral with) the plunger base 68 and the plunger mount 72. The plunger shank 70 projects radially out from the axial centerline 32 to an (e.g., cylindrical) outer surface 78 of the plunger shank 70 at the plunger outer side 66. This shank outer surface 78 is recessed radially inward from the base outer surface 76. The plunger base 68 may thereby be provided with a (e.g., annular) plunger shelf 80 at the second end 74. This plunger shelf 80 extends radially between and to the shank outer surface 78 and the base outer surface 76.

The plunger mount 72 is disposed at the plunger second end 64. The plunger mount 72 of FIG. 2, for example, projects axially out from the plunger shank 70 to the plunger second end 64. The plunger mount 72 may be channeled to provide the plunger mount 72 with one or more mount flanges 82; e.g., tabs, pedestals, ears, etc. The plunger mount 72 of FIG. 3, for example, includes a (e.g., central) plunger channel 84. This plunger channel 84 may project axially along the axial centerline 32 into the clamp plunger 24 (e.g., through the plunger mount 72) from the plunger second end 64 to an end of the plunger channel 84 formed by the plunger shank 70 (see also FIG. 4). The plunger channel 84 extends laterally (in a first lateral direction) within the clamp plunger 24 and its plunger mount 72 between the mount flanges 82. The plunger channel 84 of FIG. 4 extends laterally (in a second lateral direction perpendicular to the first lateral direction) through the clamp plunger 24 and its plunger mount 72.

The clamp retainer 26 extends longitudinally along a longitudinal centerline 86 of the clamp retainer 26 between and to a first end 88 of the clamp retainer 26 and a second end 90 of the clamp retainer 26. The clamp retainer 26 of FIG. 4 includes a first end portion 92, a second end portion 94 and an intermediate portion 96. The first end portion 92 is disposed at the retainer first end 88. The first end portion 92, for example, projects longitudinally along the longitudinal centerline 86 out from the intermediate portion 96 to the retainer first end 88. The second end portion 94 is disposed at the retainer second end 90. The second end portion 94, for example, projects longitudinally along the longitudinal centerline 86 out from the intermediate portion 96 to the retainer second end 90. The intermediate portion 96 extends longitudinally along the longitudinal centerline 86 between and is connected to (e.g., formed integral with) the first end portion 92 and the second end portion 94.

The clamp retainer 26 is movably (e.g., pivotally) coupled to the clamp plunger 24. The intermediate portion 96 of FIG. 4, for example, is arranged within the plunger channel 84. This intermediate portion 96 is pivotally attached (e.g., pinned) to the plunger mount 72 and its mount flanges 82 (see also FIG. 3). With this arrangement, the clamp retainer 26 may move (e.g., pivot) between a stowed position (e.g., see FIGS. 1 and 2) and a deployed position (e.g., see FIGS. 3 and 4). Between the stowed position of FIGS. 1 and 2 and the deployed position of FIGS. 3 and 4, the clamp retainer 26 may pivot at least seventy-five degrees (75°) about a pivot axis 98; e.g., between eight degrees (80°) and ninety degrees (90°). The present disclosure, however, is not limited to such an exemplary relationship. The pivot axis 98 of FIGS. 3 and 4 is angularly offset from (e.g., perpendicular to) and may be coincident with the axial centerline 32.

When the clamp retainer 26 is in the stowed position of FIGS. 1 and 2, the clamp retainer 26 may be substantially aligned with the clamp plunger 24. The longitudinal centerline 86, for example, may be parallel with the axial centerline 32, or angularly offset from the axial centerline 32 no more than fifteen degrees (15°); e.g., less than ten degrees (10°), but greater than zero degrees (0°). The present disclosure, however, is not limited to such an exemplary relationship. With such an arrangement, the first end portion 92 (not visible in FIGS. 1 and 2) may be positioned substantially or completely within the plunger channel 84 while the clamp retainer 26 is in its stowed position. The second end portion 94, on the other hand, may project axially along the axial centerline 32 out from the clamp plunger 24 at its second end 36.

When the clamp retainer 26 is in the deployed position of FIGS. 3 and 4, the clamp retainer 26 may be angularly offset from the clamp plunger 24. The longitudinal centerline 86, for example, may be perpendicular to the axial centerline 32, or angularly offset from the axial centerline 32 by no more five degrees (5°) or ten degrees (10°).

The retainer spring element 28 is configured to (e.g., passively) move the clamp retainer 26 from its stowed position of FIG. 2 to its deployed position of FIG. 4. The retainer spring element 28, for example, may be configured as a tension spring. A first end of the retainer spring element 28 of FIG. 4, for example, is connected (e.g., bonded or otherwise attached) to the clamp plunger 24. A second end of the retainer spring element 28 is connected (e.g., bonded or otherwise attached) to the clamp retainer 26 at a location longitudinally between the pivot axis 98 and the retainer second end 90; e.g., to the second end portion 94. When the clamp retainer 26 is in its stowed position of FIG. 2, the retainer spring element 28 may be in tension. However, when the clamp retainer 26 is in its deployed position of FIG. 4, the retainer spring element 28 may be relaxed. With such an arrangement, the retainer spring element 28 biases the clamp retainer 26 towards its deployed position.

Referring to FIG. 2, the plunger spring element 30 is mounted on the clamp plunger 24. The plunger spring element 30 of FIG. 2, in particular, is mounted on and circumscribes the plunger shank 70. The assembly of the clamping device elements 24, 26, 28 and 30 is mated with the clamp base 22. The clamp plunger 24 of FIG. 2, for example, is disposed within the base aperture 46. The plunger spring element 30 is also disposed within the base aperture 46 and, more particularly, in the counterbore 50. The plunger spring element 30 extends axially along the axial centerline 32 between and engages (e.g., contacts) the base shelf 52 and the plunger shelf 80. When the clamp plunger 24 is in its extended position of FIG. 4, the plunger spring element 30 may be axially compressed between the clamp base 22 and the clamp plunger 24. However, when the clamp plunger 24 is in its retracted position of FIG. 2, the plunger spring element 30 may be less axially compressed or relaxed between the clamp base 22 and the clamp plunger 24. Thus, the plunger spring element 30 may be configured as a compression spring. With such an arrangement, the plunger spring element 30 biases the clamp plunger 24 towards its retracted position.

When the clamp plunger 24 is in the retracted position of FIG. 2, the plunger base 68 may be exterior of (e.g., outside of) the clamp base 22 towards the base first end 34. The clamp plunger 24, however, projects axially along the axial centerline 32 into the base aperture 46 to the plunger second end 64. More particularly, the plunger shank 70 may project axially out from the plunger base 68, through the counterbore 50, and partially into the bore 48 to the plunger mount 72. The plunger mount 72 may extend axially within the bore 48. With this arrangement, the pivot axis 98 is recessed axially inward from the base second end 36; although, the second end portion 94 may project axially out from the base aperture 46 and the base second end 36. To facilitate this arrangement, the clamp retainer 26 is arranged in its stowed position when the clamp plunger 24 is in its retracted position. Furthermore, while the clamp plunger 24 is in its retracted position, the base sidewall 42 and its second inner surface 56 may hold/maintain the clamp retainer 26 in its stowed position. More particularly, the second inner surface 56 forms a stop to prevent pivoting of the clamp retainer 26 about its pivot axis 98.

When the clamp plunger 24 is in the extended position of FIG. 4, the plunger base 68 may be disposed within the base aperture 46. The plunger shank 70 may extend axially through the bore 48 and out of the base aperture 46. The plunger mount 72 may be exterior of the clamp base 22 towards the base second end 36. With this arrangement, the pivot axis 98 is displaced out from the clamp base 22. The clamp retainer 26 may thereby freely move (e.g., pivot) from its stowed position to its deployed position.

Figure 5:
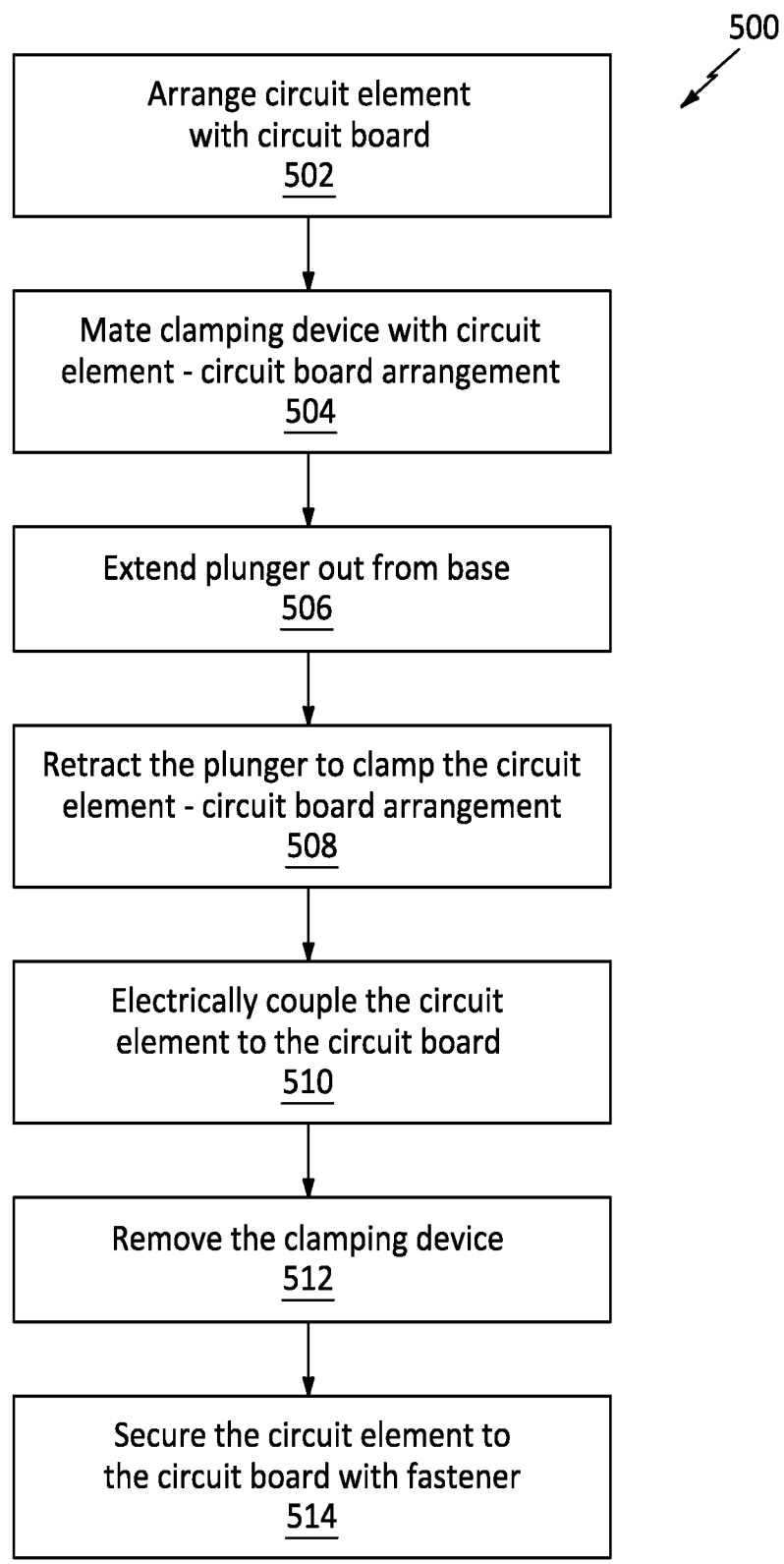
FIG. 5 is a flow diagram of a method of assembling an apparatus.

FIG. 5 is a flow diagram of a method 500 for assembling an apparatus. For ease of description, this assembly method 500 is described below with reference to the clamping device 20 of FIGS. 1-4. The assembly method 500, however, is not limited to using such an exemplary clamping device.

Figure 6A:
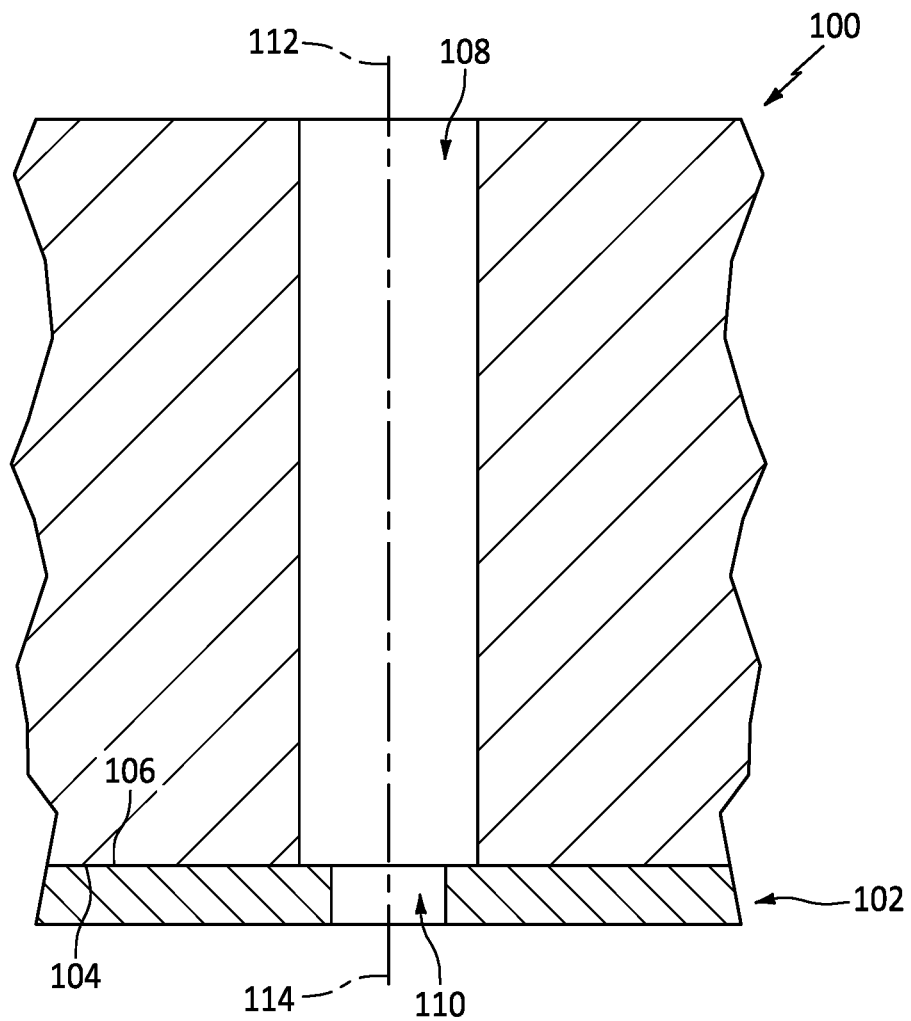
FIGS. 6A-F are partial sectional illustrations depicting a sequence of steps for assembling the apparatus.

In step 502, referring to FIG. 6A, a circuit element 100 is arranged with a circuit board 102. The circuit element 100 of FIG. 6A, for example, is positioned vertically on top of the circuit board 102 such that a bottom side 104 of the circuit element 100 may engage (e.g., contact, abut against, etc.) a top side 106 of the circuit board 102. An element aperture 108 in the circuit element 100 may also be aligned with (e.g., positioned coaxial with) a board aperture 110 in the circuit board 102. The element aperture 108 of FIG. 6A, for example, extends axially along a centerline 112 of the element aperture 108 through the circuit element 100. The board aperture 110 of FIG. 6A extends axially along a centerline 114 of the board aperture 110 through the circuit board 102. The element aperture centerline 112 may be coaxial with the board aperture centerline 114. In addition or alternatively, at least one of the apertures 108, 110 (e.g., the element aperture 108) may completely overlap the other one of the apertures 110, 108 (e.g., the board aperture 110).

The circuit element 100 may be configured as or otherwise include a processing device, a memory device, a resistor, a capacitor, a transistor, an inductor, a diode, a switch, an input device, and/or an output device. The circuit board 102 may be configured as or otherwise include a printed circuit board (PCB), also referred to as a printed wiring board (PWB). Here, for ease of description, the apparatus being assembled by the assembly method 500 is described as an electronic device. Examples of the electronic device include, but are not limited to, a controller, a sensor system, a communication system and a processing system. The present disclosure, however, is not limited to assembling such exemplary electronic devices. Moreover, the present disclosure is not limited to assembling a circuit element to a circuit board. The assembly method 500, for example, may alternatively be used to assemble various other types of bodies together; e.g., an element to a substrate.

Figure 6B:
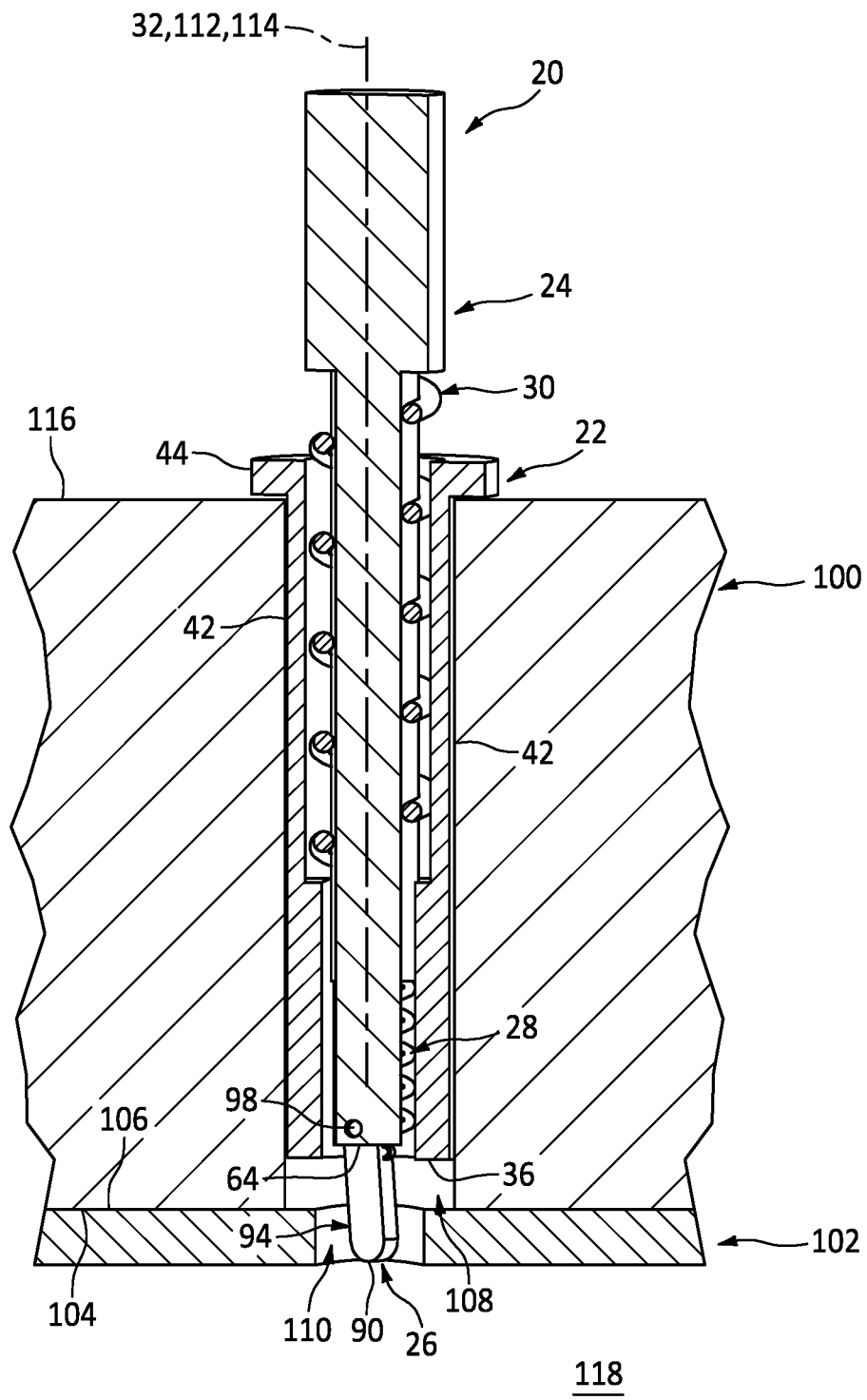

In step 504, referring to FIG. 6B, the clamping device 20 is mated with an arrangement of the circuit element 100 and the circuit board 102. For example, while the clamp plunger 24 is in its retracted position and while the clamp retainer 26 is in its stowed position, the clamping device 20 may be inserted into the element aperture 108. The base flange 44 of FIG. 6B, for example, may axially engage (e.g., contact, abut against, rest on, etc.) a top side 116 of the circuit element 100. The base sidewall 42 may project partially into the element aperture 108 (out from the base flange 44) to the base second end 36. The clamp retainer 26 and its second end portion 94 may project into the element aperture 108 and/or the board aperture 110 (out from the clamp base 22) to the retainer second end 90. As the clamping device 20 is being inserted into the element aperture 108, the clamping device 20 may be translated axially along the centerline 112, 114, which centerline 112, 114 may also be coaxial with the axial centerline 32. During this translation, the various clamping device elements 22, 24, 26, 28 and 30 may move together. More particular, the various clamping device elements 22, 24, 26, 28 and 30 may move as a single unit, without relative movement between (e.g., any) of the various clamping device elements 22, 24, 26, 28 and 30 for example.

Figure 6C:
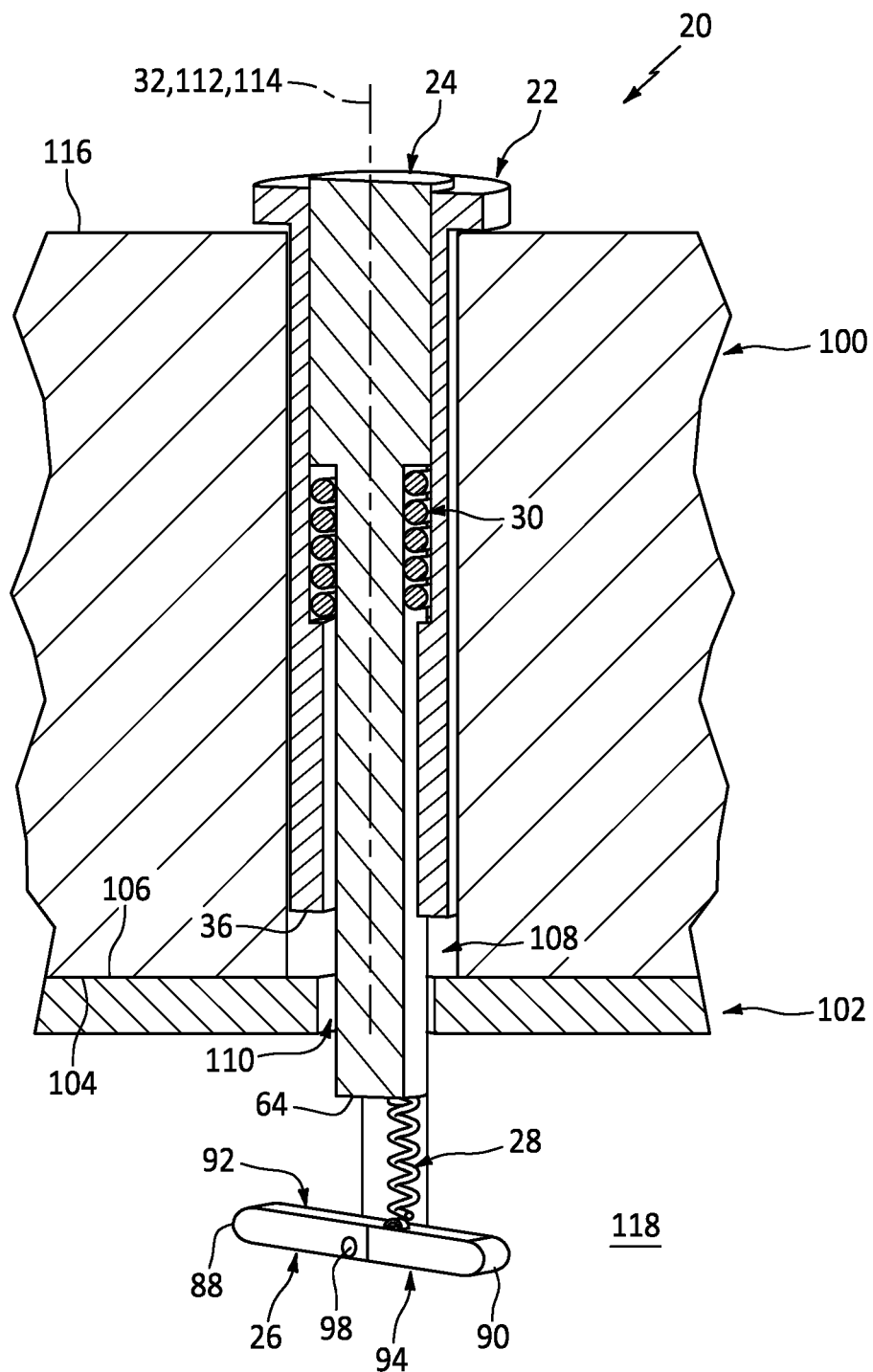

In step 506, referring to FIG. 6C, the clamp plunger 24 is extended out from the clamp base 22. The clamp plunger 24 of FIG. 6C, for example, is translated axially along the centerline 32, 112, 114 in a first direction (e.g., a vertical downward direction) relative to the clamp base 22. The plunger second end 64 may thereby move axially out of the element aperture 108, through the board aperture 110, and into an adjacent volume 118; e.g., a plenum, a cavity, a workspace, etc. This volume 118 may be adjacent, vertically below and/or at least partially formed by the circuit board 102. When the clamp plunger 24 is in (or close to) its extended position, the retainer spring element 28 may pivot the clamp retainer 26 within the volume 118 about the pivot axis 98 from the stowed position to the deployed position. More particularly, the clamp retainer 26 may begin to pivot from its stowed position to its deployed position as soon as, for example, the retainer first end 88 clears (e.g., is exterior of) the circuit board 102 and its board aperture 110.

Figure 6D:
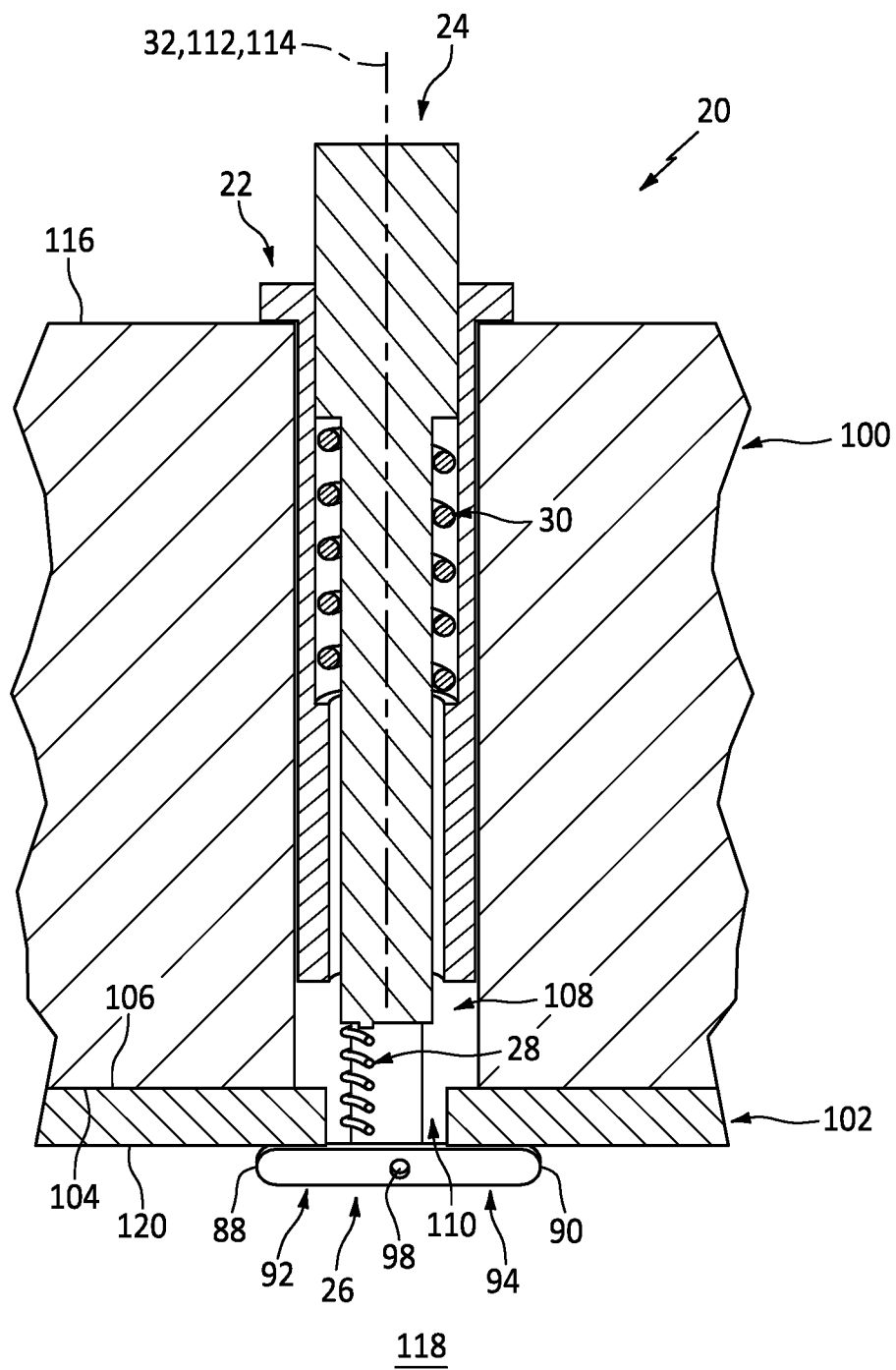

In step 508, referring to FIG. 6D, the clamp plunger 24 is retracted at least partially back into the clamp base 22. The clamp plunger 24 of FIG. 6D, for example, is translated axially along the centerline 32, 112, 114 in a second direction (e.g., a vertical upward direction, a direction opposite the first direction) relative to the clamp base 22. The clamp plunger 24 may thereby move (e.g., translate) the clamp retainer 26 axially in the second direction until the clamp retainer 26 engages a bottom side 120 of the circuit board 102. When the clamp retainer 26 engages the circuit board 102 (and the clamp base 22 engages the circuit element 100 as described above), the clamping device 20 is in a clamped arrangement. The plunger spring element 30, for example, continues to bias the clamp plunger 24 back to its retracted position such that the circuit element 100 and the circuit board 102 are clamped axially between the clamp base 22 and the clamp retainer 26. More particularly, the circuit element 100 is clamped axially between the clamp base 22 and the circuit board 102, and the circuit board 102 is clamped axially between the circuit element 100 and the clamp retainer 26. The biasing force of the plunger spring element 30 may be sized such that the circuit element 100 is seated flush against the circuit board 102; e.g., in the same position that it will later be placed when the circuit element 100 is fastened to the circuit board 102.

Figure 6E:
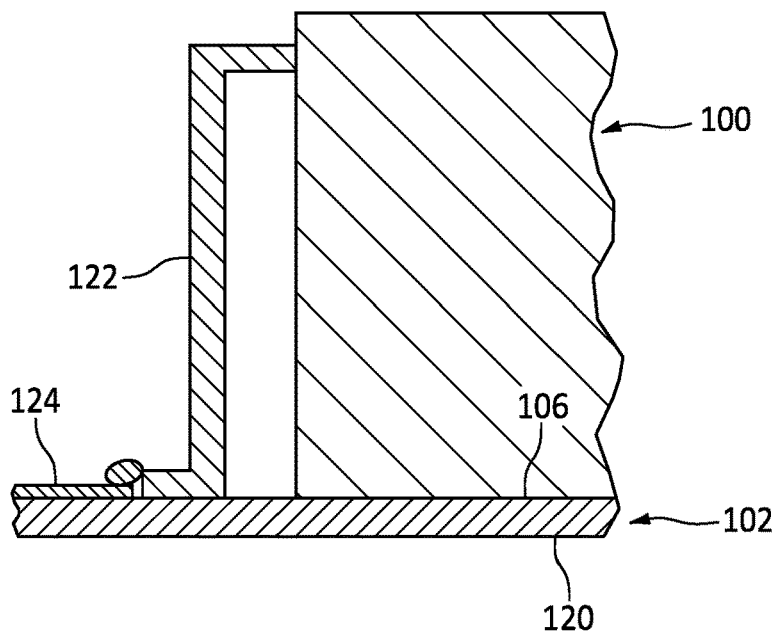

In step 510, referring to FIG. 6E, the circuit element 100 is electrically coupled to the circuit board 102. One or more electrical leads 122 (one visible in FIG. 6E) from the circuit element 100, for example, may be soldered or otherwise electrically coupled with one or more respective conductive paths 124 (e.g., traces; one visible in FIG. 6E) on the circuit board 102.

In step 512, the clamping device 20 is removed from the circuit element-circuit board arrangement. An operator (e.g., assembly personnel), for example, may (e.g., manually) move the clamp plunger 24 back to its extended position and (e.g., manually) pivot the clamp retainer 26 back to its stowed position. While maintaining the clamp retainer 26 in its stowed position, the operator may allow the plunger spring element 30 to move the clamp plunger 24 back to its retracted position. The clamping device 20 may subsequently be removed from the element aperture 108.

Figure 6F:
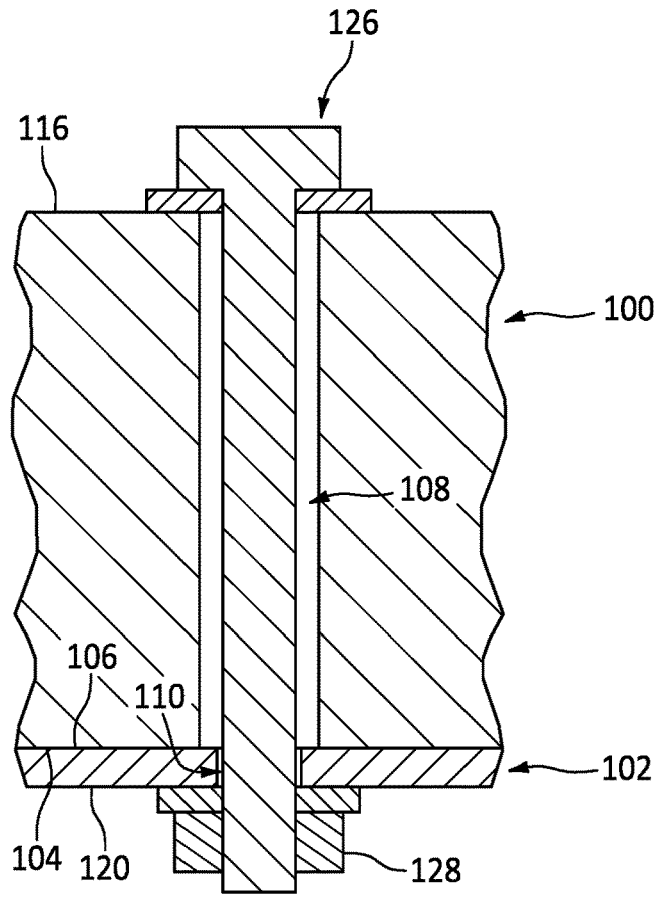

In step 514, referring to FIG. 6F, the circuit element 100 is secured to the circuit board 102 with a fastener 126. An end of the fastener 126 of FIG. 6F, for example, passes sequentially through the element aperture 108 and the board aperture 110 (or vice versa) and is mated with a nut 128 to mechanically fasten the circuit element 100 to the circuit board 102.

Figure 7:
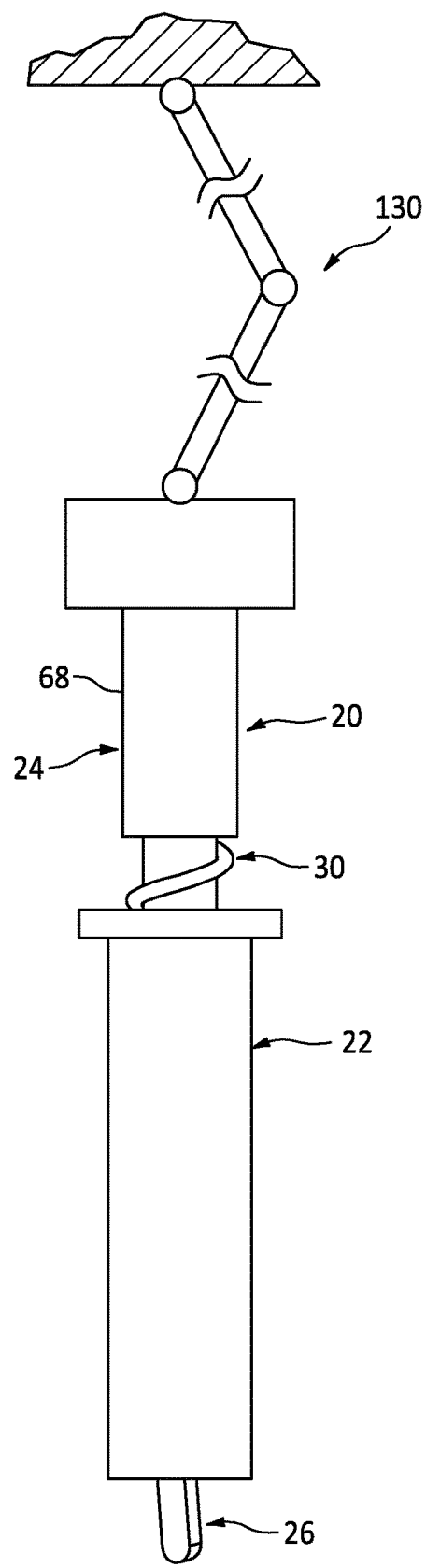
FIG. 7 is an illustration of the clamping device configured with a manipulator (schematically shown).

In some embodiments, referring to FIG. 7, the clamping device 20 may be moved during at least the steps 504, 506 and/or 508 by a manipulator 130 (schematically shown); e.g., a robotic pick and place machine. The manipulator 130 of FIG. 7, for example, may attached (e.g., via a suction/vacuum head) to the plunger base 68. The manipulator 130 may then push the clamp plunger 24 and its plunger base 68 in the first direction and/or pull the clamp plunger 24 and its plunger base 68 in the second direction to facilitate operation of the clamping device 20. By using the manipulator 130, the clamping device 20 may be precisely mated with the circuit element-circuit board arrangement (e.g., see FIGS. 6B-D) without, for example, rubbing against, moving and/or damaging the circuit element 100 and/or the circuit board 102. Furthermore, the circuit element 100 may be clamped to the circuit board 102 without requiring access to the volume 118 beneath the circuit board 102 prior to electrically coupling the circuit element 100 to the circuit board 102. Of course, in other embodiments, it is contemplated any one or more of the steps 504, 506 and/or 508 may alternatively be performed manually by the operator; e.g., where the apertures 108 and 110 are large enough for accurate clamping device placement.

Figure 8:
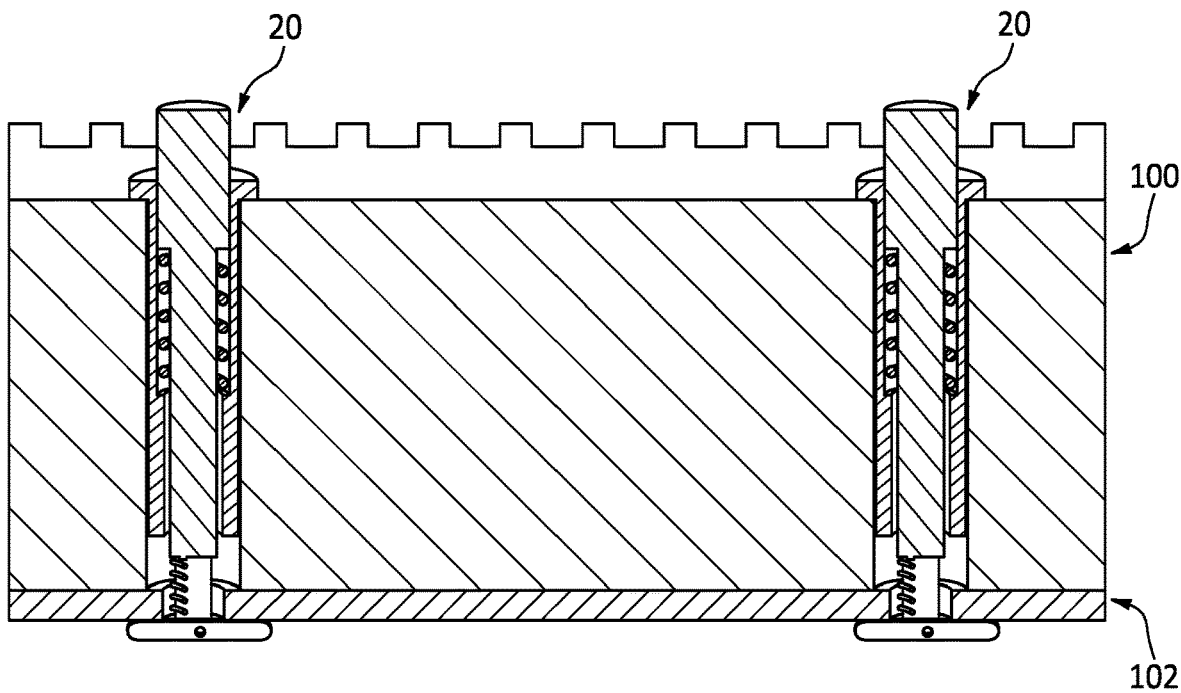
FIG. 8 is a partial perspective cutaway illustration of multiple clamping devices clamping a circuit element to a circuit board.

While the assembly method 500 is described above with respect to using a single clamping device 20 to clamp the circuit element 100 to the circuit board 102, the foregoing method steps may alternatively be repeated one or more times to utilize multiple of the clamping devices 20. For example, referring to FIG. 8, two (or more) of the clamping devices 20 may be used to clamp the circuit element 100 to the circuit board 102 to facilitate the electrically coupling therebetween.

Figure 9:
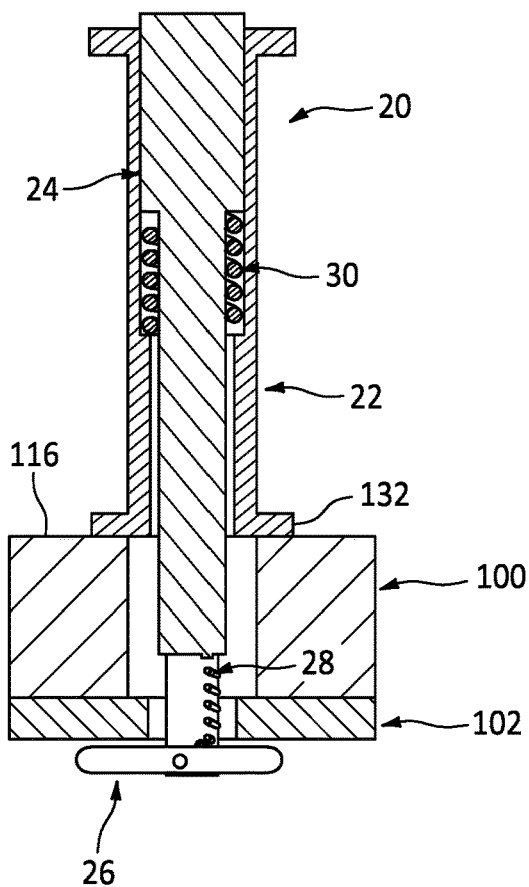
FIG. 9 is a partial perspective cutaway illustration of another clamping device clamping a circuit element to a circuit board.

In some embodiments, referring to FIG. 6B, the clamp base 22 of each clamping device 20 may be mated with (e.g., inserted into) a respective element aperture 108. In other embodiments, referring to FIG. 9, the clamp base 22 of at least one, some or all of the clamping devices 20 may remain exterior of the circuit element 100. Each clamp base 22 of FIG. 9, for example, includes a second end flange 132 that axially engages and rests against the top side 116 of the circuit element 100.

While various embodiments of the present disclosure have been described, it will be apparent to those of ordinary skill in the art that many more embodiments and implementations are possible within the scope of the disclosure. For example, the present disclosure as described herein includes several aspects and embodiments that include particular features. Although these features may be described individually, it is within the scope of the present disclosure that some or all of these features may be combined with any one of the aspects and remain within the scope of the disclosure. Accordingly, the present disclosure is not to be restricted except in light of the attached claims and their equivalents.

What is claimed is:

1. A method for assembling an apparatus, comprising:
   arranging a circuit element with a circuit board, wherein
      the circuit element comprises an element aperture, and
      the circuit board comprises a board aperture;
   moving a plunger in a first direction to pass a distal end of the plunger through the element aperture and the board aperture and into a volume adjacent the circuit board;
   pivoting a retainer within the volume, wherein the retainer is pivotally mounted to the plunger at the distal end of the plunger;
   moving the plunger in a second direction to clamp the circuit board between the retainer and the circuit element;
   electrically coupling the circuit element to the circuit board;
   removing a clamping device from the circuit element and the circuit board, wherein the clamping device includes the plunger and the retainer; and
   securing the circuit element to the circuit board with a fastener, wherein the fastener extends through the element aperture and the board aperture.

2. The method of claim 1, wherein
   the moving of the plunger in the first direction comprises translating the plunger in the first direction along a centerline; and
   the pivoting of the retainer comprises pivoting the retainer within the volume about an axis that is angularly offset from the centerline.

3. The method of claim 1, wherein the retainer is pivoted at least seventy-five degrees within the volume.

4. The method of claim 1, wherein the pivoting of the retainer within the volume is passively actuated.

5. The method of claim 1, wherein the retainer is pivoted within the volume by a spring element.

6. The method of claim 5, wherein the spring element is a tension spring element.

7. The method of claim 1, wherein the plunger is moved in the second direction using at least a spring element.

8. The method of claim 7, wherein the spring element is a compression spring element.

9. The method of claim 1, wherein
   the plunger is arranged with a clamp base;
   the plunger moves relative to the clamp base during at least a portion of the moving of the plunger in the first direction and during the moving of the plunger in the second direction; and
   the circuit element and the circuit board are clamped between the clamp base and the retainer.

10. The method of claim 1, wherein
    the plunger is arranged with a clamp base;
    the plunger moves with the clamp base during a first portion of the moving of the plunger in the first direction;
    the plunger moves relative to the clamp base during a second portion of the moving of the plunger in the first direction; and
    the circuit element and the circuit board are clamped between the clamp base and the retainer.

11. The method of claim 1, wherein the plunger is disengaged from the circuit board while the circuit board is clamped between the retainer and the circuit element.

12. The method of claim 1, further comprising soldering a lead of the circuit element to a conductive path of the circuit board while the circuit board is clamped between the retainer and the circuit element.

13. The method of claim 1, further comprising moving the plunger in the first direction using a manipulator.

14. The method of claim 1, further comprising:
    moving a second plunger in the first direction to pass a distal end of the second plunger through a second element aperture in the circuit element and a second board aperture in the circuit board and into the volume;

pivoting a second retainer within the volume, wherein the second retainer is pivotally mounted to the second plunger at the distal end of the second plunger; and moving the second plunger in the second direction to further clamp the circuit board between the second retainer and the circuit element.

15. A method for assembling an apparatus, comprising:

arranging a first element with a substrate, wherein the first element comprises an element aperture, and the substrate comprises a substrate aperture;

moving a plunger in a first direction to pass a distal end of the plunger through the element aperture and the substrate aperture and into a volume adjacent the substrate;

pivoting a retainer within the volume, wherein the retainer is pivotally mounted to the plunger at the distal end of the plunger; and moving the plunger in a second direction opposite the first direction to clamp the first element and the substrate between the retainer and a clamp base, wherein the plunger is movably mated with the clamp base, and the plunger is moved in the second direction using at least a spring element biased between the plunger and the clamp base;

electrically coupling the first element to the substrate;

removing the plunger and retainer from the first element and the substrate; and securing the first element to the substrate with a fastener, wherein the fastener extends through the element aperture and the substrate aperture.

16. The method of claim 15, wherein the first element comprises a circuit element; and the substrate comprises a printed circuit board.

17. The method of claim 15, wherein the retainer includes a first end portion, a second end portion and an intermediate portion;

the first end portion and the second end portion are each abutted against the substrate when the first element and the substrate are clamped between the retainer and the clamp base; and the intermediate portion is between the first end portion and the second end portion, and the intermediate portion is pivotally mounted to the plunger.

18. A clamping device, comprising:

a clamp base comprising a base shelf and a base aperture, the base aperture extending axially along a centerline through the clamp base, the base aperture including a bore and a counterbore, and the base shelf formed within the base aperture at an axial location between a bore and a counterbore;

a plunger mated with the base aperture and configured to move relative to the clamp base between a retracted position and an extended position, the plunger including a plunger base, a shank and a mount, the plunger base include a plunger shelf at an end, and the shank projecting axially along the centerline from plunger base, out of the base aperture, to the mount when the plunger is in the extended position;

a first spring element disposed within the base aperture and compressed between the base shelf and the plunger shelf when the plunger is in the extended position;

a retainer pivotally attached to the mount and configured to pivot between a stowed position and a deployed position, the retainer in the stowed position and within the base aperture when the plunger is in the retracted position, and the retainer in the deployed position and exterior to the clamp base when the plunger is in the extended position; and a second spring element configured to pivot the retainer from the stowed position to the deployed position.

19. The clamping device of claim 18, wherein the first spring element comprises a compression spring element; and the second spring element comprises a tension spring element.

* * * * *